United States Patent
Kachi et al.

(10) Patent No.: US 8,698,250 B2
(45) Date of Patent: Apr. 15, 2014

(54) SEMICONDUCTOR DEVICE

(75) Inventors: Takao Kachi, Tokyo (JP); Yasuhiro Yoshiura, Tokyo (JP); Fumihito Masuoka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 58 days.

(21) Appl. No.: 13/525,478

(22) Filed: Jun. 18, 2012

(65) Prior Publication Data

US 2013/0093065 A1    Apr. 18, 2013

(30) Foreign Application Priority Data

Oct. 12, 2011 (JP) ................... 2011-224517

(51) Int. Cl.
*H01L 21/70* (2006.01)
(52) U.S. Cl.
USPC .......................................... 257/376
(58) Field of Classification Search
USPC .......................................... 257/376
See application file for complete search history.

(56) References Cited

U.S. PATENT DOCUMENTS

| | | |
|---|---|---|
| 6,603,189 B2 | 8/2003 | Takahashi |
| 2004/0041225 A1 * | 3/2004 | Nemoto ................. 257/458 |
| 2009/0283799 A1 * | 11/2009 | Ruething et al. ........... 257/143 |

FOREIGN PATENT DOCUMENTS

| | | |
|---|---|---|
| JP | 2003-249662 | 9/2003 |
| JP | 2007-251003 | 9/2007 |
| WO | WO99/09600 | 2/1999 |

* cited by examiner

*Primary Examiner* — Julio J Maldonado
*Assistant Examiner* — Hajar Kolahdouzan
(74) *Attorney, Agent, or Firm* — Oblon, Spivak, McClelland, Maier & Neustadt, L.L.P.

(57) ABSTRACT

A semiconductor device includes: an N-type drift layer; a P-type anode layer above the N-type drift layer; an N-type cathode layer below the N-type drift layer; a first short lifetime layer between the N-type drift layer and the P-type anode layer; and a second short lifetime layer between the N-type drift layer and the N-type cathode layer. A carrier lifetime in the first and second short lifetime layers is shorter than a carrier lifetime in the N-type drift layer. A carrier lifetime in the N-type cathode layer is longer than the carrier lifetime in the N-type drift layer.

4 Claims, 5 Drawing Sheets

SEMICONDUCTOR DEVICE

BACKGROUND OF THE INVENTION

1. Field of the Invention

The present invention relates to a diode which is one of devices constituting a power module, and more particularly, to a semiconductor device that can improve a withstand voltage while reducing reverse recovery loss and suppressing a surge voltage.

2. Background Art

Reverse recovery loss, which is an important characteristic of diodes, has relevance to the lifetime of a carrier. When, for example, the number of crystal defects is increased to shorten the lifetime, the reverse recovery loss decreases. Thus, a technique of introducing crystal defects through irradiation of an electron beam and controlling the lifetime of the entire device is used to obtain a diode which has arbitrary reverse recovery loss.

Furthermore, a diode is also proposed in which crystal defects are partially introduced between an N-type drift layer and a P-type anode layer and a short lifetime layer whose carrier has a short lifetime is provided (e.g., see Japanese Patent Laid-Open No. 2003-249662).

SUMMARY OF THE INVENTION

When the lifetime of the entire device is shortened to reduce reverse recovery loss, the number of crystal defects increases, and this causes a current reduction rate during reverse recovery to increase and causes a surge voltage to increase, which may be a cause of oscillating noise. Furthermore, the increase in the number of crystal defects causes the leakage current to increase and causes the withstand voltage to decrease. Furthermore, since the current reduction rate increases when the tail current decreases, the surge voltage increases.

When a short lifetime layer is provided only between the N-type drift layer and the P-type anode layer, a peak value of the reverse recovery current decreases, which provides an advantage that the reverse recovery current reduction rate decreases, but there is also a disadvantage that the withstand voltage decreases and the reverse recovery loss increases.

In view of the above-described problems, an object of the present invention is to provide a semiconductor device that can improve a withstand voltage while reducing reverse recovery loss and suppressing a surge voltage.

According to the present invention, a semiconductor device includes: an N-type drift layer; a P-type anode layer above the N-type drift layer; an N-type cathode layer below the N-type drift layer; a first short lifetime layer between the N-type drift layer and the P-type anode layer; and a second short lifetime layer between the N-type drift layer and the N-type cathode layer. A carrier lifetime in the first and second short lifetime layers is shorter than a carrier lifetime in the N-type drift layer. A carrier lifetime in the N-type cathode layer is longer than the carrier lifetime in the N-type drift layer.

The present invention makes it possible to improve a withstand voltage while reducing reverse recovery loss and suppressing a surge voltage.

Other and further objects, features and advantages of the invention will appear more fully from the following description.

DETAILED DESCRIPTION OF THE PREFERRED EMBODIMENTS

Figure 1:
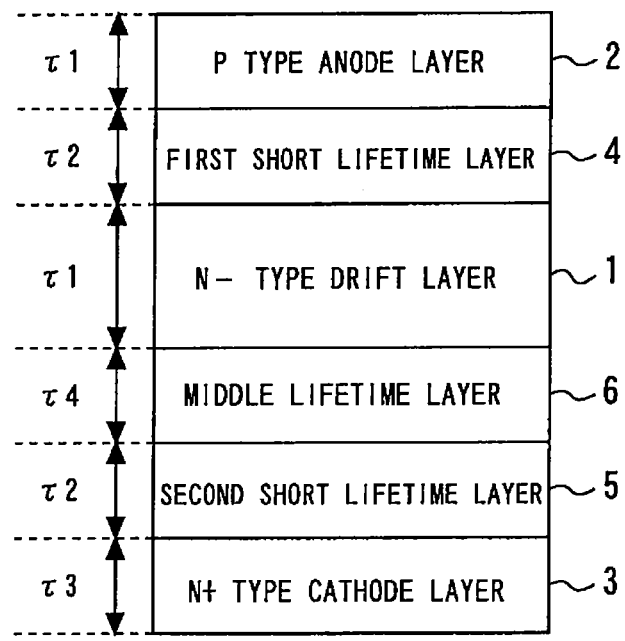
FIG. 1 is a cross-sectional view illustrating a semiconductor device according to an embodiment of the present invention.

FIG. 1 is a cross-sectional view illustrating a semiconductor device according to an embodiment of the present invention. A P-type anode layer 2 is provided above an $N^-$-type drift layer 1. An $N^+$-type cathode layer 3 is provided below the $N^-$-type drift layer 1.

A first short lifetime layer 4 is provided between the $N^-$-type drift layer 1 and the P-type anode layer 2. A second short lifetime layer 5 is provided between the $N^-$-type drift layer 1 and the $N^+$-type cathode layer 3. A middle lifetime layer 6 is provided between the $N^-$-type drift layer 1 and the second short lifetime layer 5. The first and second short lifetime layers 4 and 5, and the middle lifetime layer 6 are formed by locally irradiating protons into the $N^-$-type drift layer 1.

A carrier lifetime $\tau 2$ in the first and second short lifetime layers 4 and 5 is shorter than a lifetime $\tau 1$ in the $N^-$-type drift layer 1 ($\tau 2 < \tau 1$). A lifetime $\tau 3$ in the $N^+$-type cathode layer 3 is longer than the lifetime $\tau 1$ in the $N^-$-type drift layer 1 ($\tau 1 < \tau 3$). A lifetime $\tau 4$ and impurity concentration in the middle lifetime layer 6 take values between the second short lifetime layer 5 and the $N^-$-type drift layer 1 ($\tau 2 < \tau 4 < \tau 1$).

Figure 2:
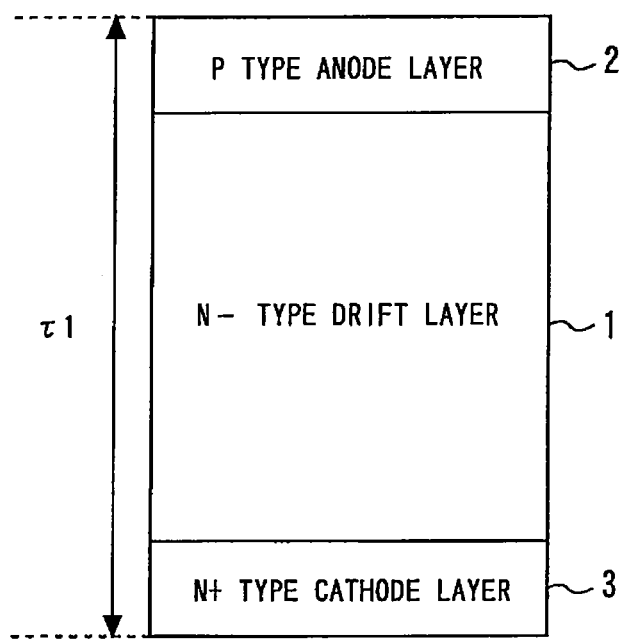
FIG. 2 is a cross-sectional view illustrating a semiconductor device according to comparative example 1.
Figure 3:
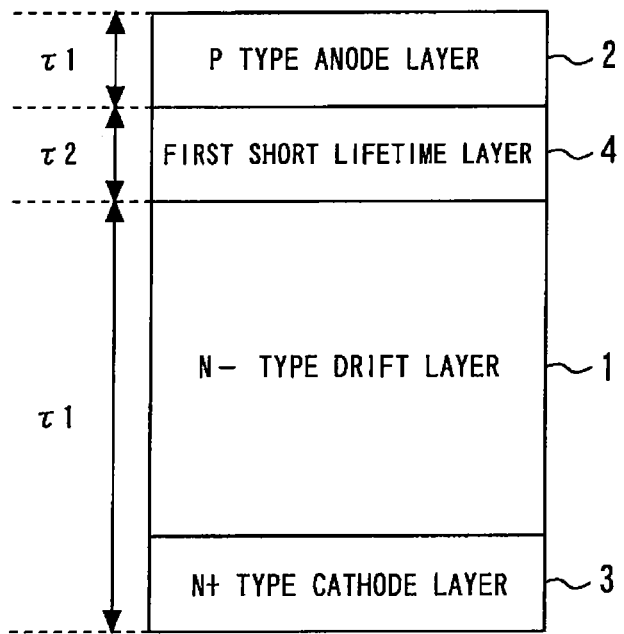
FIG. 3 is a cross-sectional view illustrating a semiconductor device according to comparative example 2.

Next, effects of the present embodiment will be described in comparison with a comparative example. FIG. 2 is a cross-sectional view illustrating a semiconductor device according to comparative example 1. The device in comparative example 1 is made up of an $N^-$-type drift layer 1, a P-type anode layer 2 and an $N^+$-type cathode layer 3, and the entire device has the same lifetime $\tau 1$. FIG. 3 is a cross-sectional view illustrating a semiconductor device according to comparative example 2. In comparative example 2, a first short lifetime layer 4 is provided between an $N^-$-type drift layer 1 and a P-type anode layer 2.

Figure 4:
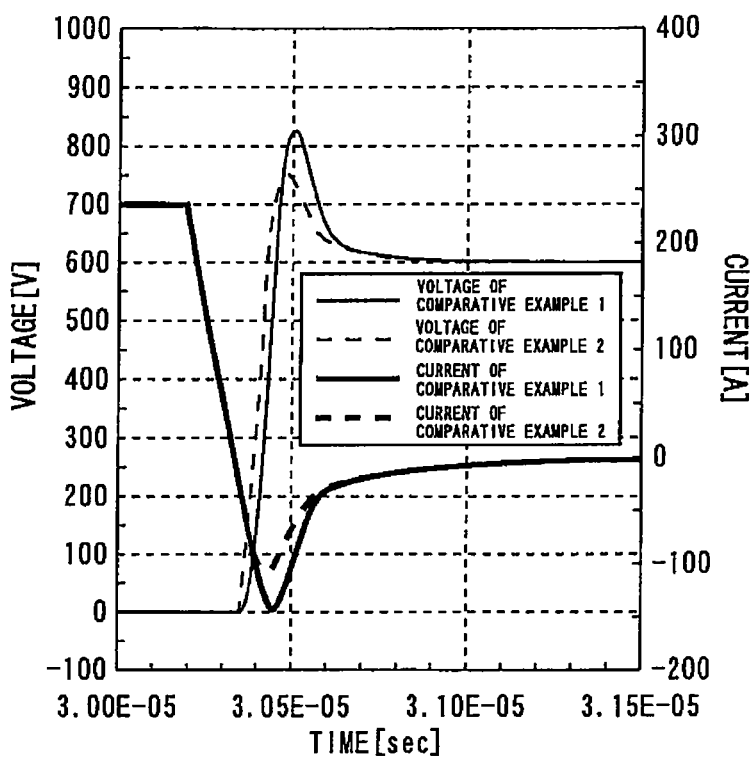
FIG. 4 is a diagram illustrating simulation results of reverse recovery waveforms during a reverse recovery operation of comparative examples 1 and 2.
Figure 5:
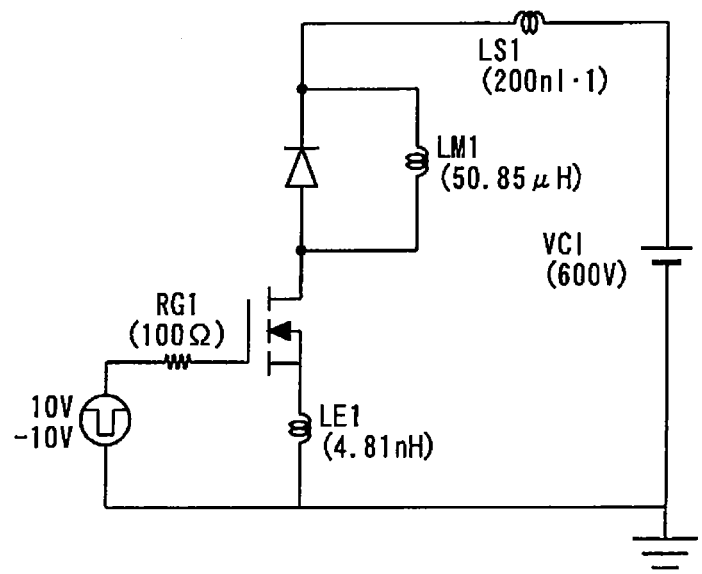
FIG. 5 is a diagram illustrating a circuit and parameters used for the simulation.

FIG. 4 is a diagram illustrating simulation results of reverse recovery waveforms during a reverse recovery operation of comparative examples 1 and 2. FIG. 5 is a diagram illustrating a circuit and parameters used for the simulation. Suppose a lifetime $\tau 1$ of the entire device in comparative example 1 was 0.7 μsec, a lifetime $\tau 2$ of the first short lifetime layer 4 in comparative example 2 was 0.03 μsec and a lifetime $\tau 1$ of the other layers was 0.7 μsec.

Carriers disappear rapidly in the first short lifetime layer 4 at the start of the reverse recovery operation. Therefore, a peak value Irr of the reverse recovery current is suppressed and the reverse recovery current reduction rate in the vicinity of the peak value Irr decreases. To be more specific, the reverse recovery current reduction rate is 858.0 A/cm$^2$/μsec in comparative example 1 and it decreases down to 587.0 A/cm$^2$/μsec in comparative example 2. Therefore, the first short lifetime layer 4 makes it possible to suppress a surge voltage dependent on the reverse recovery current reduction rate and suppress oscillating noise.

Figure 6:
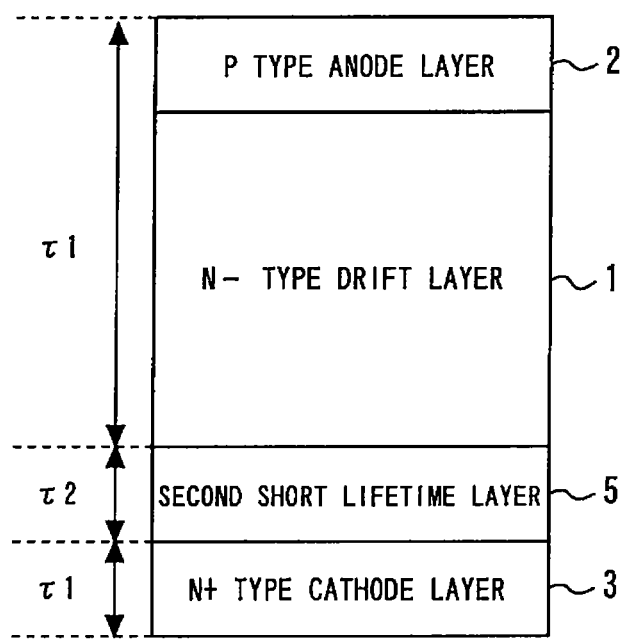
FIG. 6 is a cross-sectional view illustrating a semiconductor device according to comparative example 3.
Figure 7:
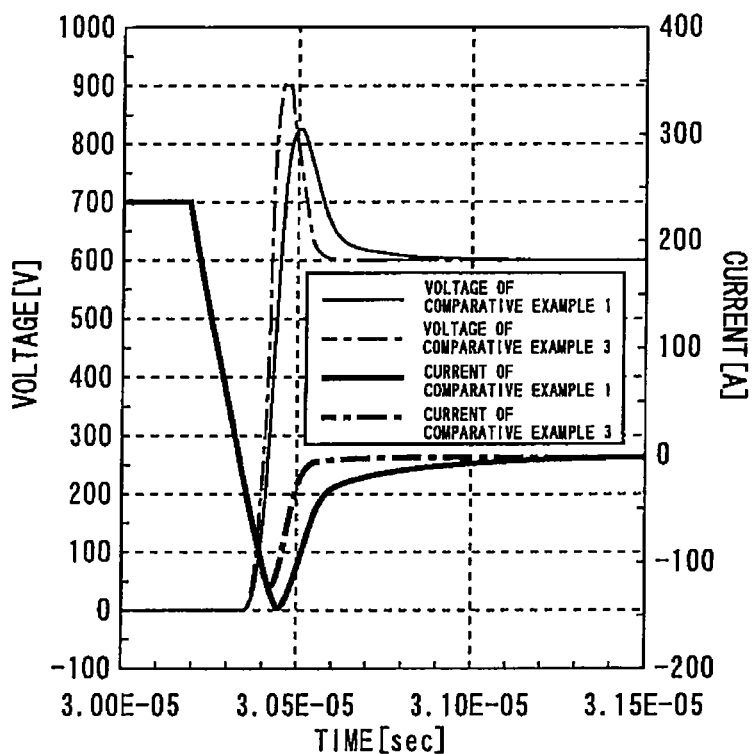
FIG. 7 is a diagram illustrating simulation results of a reverse recovery waveform during the reverse recovery operations in comparative examples 1 and 3.

FIG. 6 is a cross-sectional view illustrating a semiconductor device according to comparative example 3. In comparative example 3, a second short lifetime layer 5 is provided between an N$^-$-type drift layer 1 and an N$^+$-type cathode layer 3. FIG. 7 is a diagram illustrating simulation results of a reverse recovery waveform during the reverse recovery operations in comparative examples 1 and 3. The circuit and parameters in FIG. 5 were used for the simulation. Suppose a lifetime τ1 of the entire device in comparative example 1 was 0.7 μsec, a lifetime τ2 of the second short lifetime layer 5 in comparative example 3 was 0.03 μsec and a lifetime τ1 of the other layers was 0.7 μsec.

Carriers disappear rapidly in the second short lifetime layer 5 during the reverse recovery operation. Therefore, a tail current drastically decreases and reverse recovery loss can be significantly reduced. Furthermore, a pseudo-buffer layer is formed with a donation effect through proton irradiation. This makes uniform an electric field distribution in a depleted layer which is generated when a voltage is applied over the entire drift layer, and can thereby improve a withstand voltage.

Figure 8:
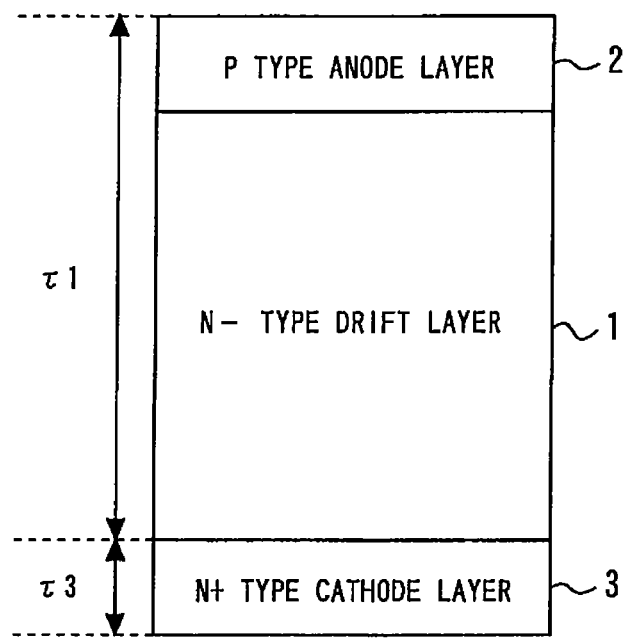
FIG. 8 is a cross-sectional view illustrating a semiconductor device according to comparative example 4.
Figure 9:
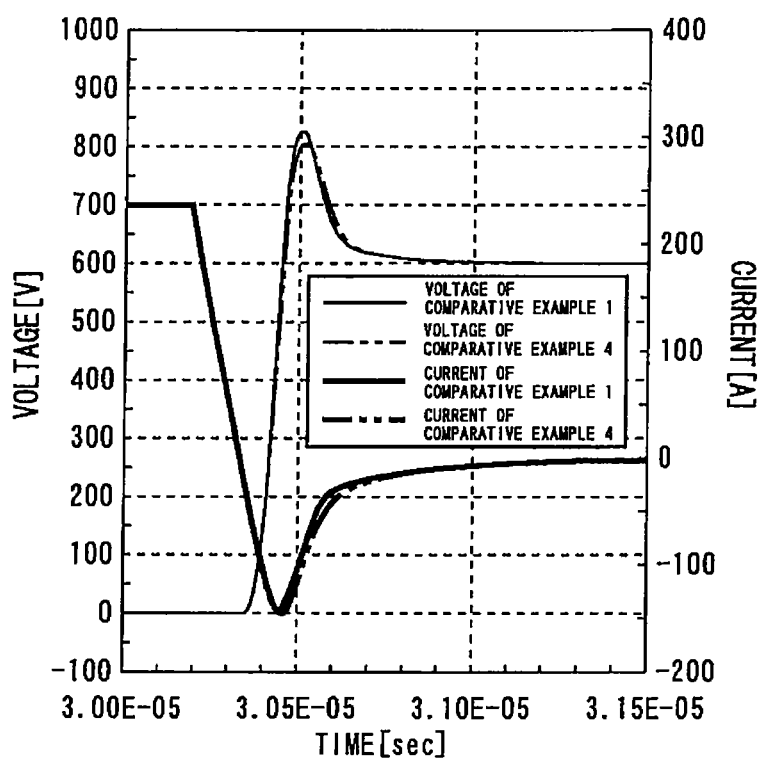
FIG. 9 is a diagram illustrating simulation results of a reverse recovery waveform during a reverse recovery operation in comparative examples 1 and 4.

FIG. 8 is a cross-sectional view illustrating a semiconductor device according to comparative example 4. In comparative example 4, a lifetime τ3 in an N$^+$-type cathode layer 3 is longer than a lifetime τ1 in an N$^-$-type drift layer 1. FIG. 9 is a diagram illustrating simulation results of a reverse recovery waveform during a reverse recovery operation in comparative examples 1 and 4. The circuit and parameters in FIG. 5 were used for the simulation. In comparative example 4, the impurity concentration of the N$^+$-type cathode layer 3 was increased to extend the lifetime. Suppose the impurity concentration of the N$^+$-type cathode layer 3 in comparative example 1 was 1.0 E+19 atom/cm$^3$ and the impurity concentration of the N$^+$-type cathode layer 3 in comparative example 4 was 1.0 E+20 atom/cm$^3$.

When the lifetime in the N$^+$-type cathode layer 3 is extended, carriers disappear slowly immediately before loss of a tail current of the reverse recovery operation. For this reason, the reverse recovery current reduction rate decreases. To be more specific, the reverse recovery current reduction rate is 858.0 A/cm$^2$/μsec in comparative example 1, whereas it decreases down to 818.0 A/cm$^2$/μsec in comparative example 4. Therefore, it is possible to suppress a surge voltage which is dependent on the reverse recovery current reduction rate and suppress oscillating noise.

As described above, the first short lifetime layer 4 has an advantage that the peak value of the reverse recovery current decreases and the reverse recovery current reduction rate decreases, whereas the first short lifetime layer 4 also has a disadvantage that the withstand voltage decreases and the reverse recovery loss increases. Furthermore, the second short lifetime layer 5 causes the tail current to drastically decrease, providing an advantage that the withstand voltage improves and the reverse recovery loss decreases, whereas the second short lifetime layer 5 has a disadvantage that the peak value of the reverse recovery current increases and the reverse recovery current reduction rate increases. Furthermore, extending the lifetime in the N$^+$-type cathode layer 3 provides an advantage that the reverse recovery current reduction rate decreases immediately before the tail current disappears, whereas it has a disadvantage that the reverse recovery loss deteriorates.

These disadvantages of the first and second short lifetime layers 4 and 5, and the N$^+$-type cathode layer 3 are canceled out and only advantages remain. Therefore, it is possible to improve the withstand voltage while reducing reverse recovery loss. Furthermore, since the reverse recovery current reduction rate in the vicinity of the peak value and before tail current loss decreases during a reverse recovery operation, it is possible to suppress a surge voltage. Therefore, it is possible to suppress oscillating noise when the reverse recovery loss decreases.

Furthermore, the middle lifetime layer 6 can reduce the reverse recovery loss and improve the withstand voltage as in the case of the second short lifetime layer 5. Since the lifetime and impurity concentration in the middle lifetime layer 6 take values between the second short lifetime layer 5 and the N$^-$-type drift layer 1, the middle lifetime layer 6 functions as a buffer layer connecting both layers.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-224517, filed on Oct. 12, 2011 including specification, claims, drawings and summary, on which the Convention priority of the present application is based, are incorporated herein by reference in its entirety.

What is claimed is:

1. A semiconductor device comprising: an N-type drift layer; a P-type anode layer above the N-type drift layer; an N-type cathode layer below the N-type drift layer; a first short lifetime layer between the N-type drift layer and the P-type anode layer; and a second short lifetime layer between the N-type drift layer and the N-type cathode layer, wherein a carrier lifetime in the first and second short lifetime layers is shorter than a carrier lifetime in the N-type drift layer, and a carrier lifetime in the N-type cathode layer is longer than the carrier lifetime in the N-type drift layer.

2. The semiconductor device according to claim 1, further comprising a middle lifetime layer between the N-type drift layer and the second short lifetime layer, wherein a lifetime and impurity concentration in the middle lifetime layer take values between the second short lifetime layer and the N-type drift layer.

3. The semiconductor device according to claim 2, wherein each of the first short lifetime layer, second short lifetime layer and middle lifetime layer comprises a proton-irradiation region.

4. The semiconductor device according to claim 1, wherein each of the first short lifetime layer and second short lifetime layer comprises proton-irradiation regions.

* * * * *